(12) United States Patent
Lam

(10) Patent No.: US 9,936,571 B2
(45) Date of Patent: Apr. 3, 2018

(54) PRINTED CIRCUIT BOARD

(71) Applicant: SAE Magnetics (H.K.) Ltd., Hong Kong (CN)

(72) Inventor: Fuk Ming Lam, Hong Kong (CN)

(73) Assignee: SAE MAGNETICS (H.K.) LTD., Hong Kong (CN)

( * ) Notice: Subject to any disclaimer, the term of this patent is extended or adjusted under 35 U.S.C. 154(b) by 135 days.

(21) Appl. No.: 14/843,115

(22) Filed: Sep. 2, 2015

(65) Prior Publication Data

US 2017/0064817 A1  Mar. 2, 2017

(51) Int. Cl.
*H05K 1/02* (2006.01)
*H05K 1/11* (2006.01)

(52) U.S. Cl.
CPC ......... *H05K 1/0245* (2013.01); *H05K 1/0215* (2013.01); *H05K 1/0248* (2013.01); *H05K 1/115* (2013.01)

(58) Field of Classification Search
CPC .. H05K 1/0245; H05K 1/0215; H05K 1/0248; H05K 1/115
USPC .................... 333/5, 104, 161, 204, 238, 246
See application file for complete search history.

(56) References Cited

U.S. PATENT DOCUMENTS

| 7,154,356 B2* | 12/2006 | Brunette | H05K 1/0222 174/250 |
| 8,822,831 B2* | 9/2014 | Yokoyama | H05K 1/0251 174/255 |
| 2007/0119615 A1* | 5/2007 | Kobayashi | H05K 1/0228 174/250 |
| 2014/0196941 A1* | 7/2014 | Hidaka | H05K 1/116 174/266 |

OTHER PUBLICATIONS

Hartley, Rick, "RF/Microwave PC Board Design and Layout", L-3 Avionics Systems, Jan. 2005, slide 109.*

* cited by examiner

*Primary Examiner* — Benny Lee
*Assistant Examiner* — Hafizur Rahman
(74) *Attorney, Agent, or Firm* — Nixon & Vanderhye PC

(57) ABSTRACT

A PCB includes a PCB body at least including a first metal layer, a second metal layer, and a first ground layer sandwiched therebetween; and a pair of transmission lines including a first transmission line conductor and a second transmission line conductor. The first transmission line conductor is located in the first metal layer which has two straight line sections at its two ends and a curved line section at its middle, the second transmission line conductor has two straight line sections at its two ends which are located in the first metal layer and a cross-via structure at the middle which has a buried trace buried in the second metal layer, and the curved line section and the buried trace are isolated by the first ground layer. Skew effect of the differential transmission circuit is reduced, thereby improving the signal transmission quality and improve signal transmission speed.

10 Claims, 9 Drawing Sheets

PRINTED CIRCUIT BOARD

FIELD OF THE INVENTION

The present invention relates to differential signal transmission in a printed circuit board (PCB), and more particularly to high-speed differential signal transmitted on the differential transmission lines.

BACKGROUND OF THE INVENTION

A transmission line is used for high-speed digital signal transmission. For example, differential transmission is generally used for transmitting digital signal with data rate of hundreds of Mbps or higher, and a transmission line for performing the differential transmission is a differential transmission line. Conventional differential transmission line on a planar structure, such as PCB, is formed by a pair of (two) transmission line conductors constructing in a strip shape, and formed in the same layer. One of the conductors carries a positive voltage, and the other conductor carries a negative voltage. The pair of transmission line conductors are generally formed to be parallel to each other and to extend in a straight line shape. The differential transmission is advantageous in that the amplitude of a signal voltage is made to be small, and thus influence of noise hardly exerts.

Generally, high-speed transmission of the differential signal requires the difference in transmission time between the signals (referred to as a skew hereinafter) to be minimal. It is necessary to greatly reduce a skew between the differential transmission lines in order to achieve high-speed digital signal transmission on a low voltage differential signaling system. Nowadays in many applications, differential transmission lines are used as medium for high-speed data transmission between at least two devices. These devices are usually placed in the same outer layer (top or bottom layer) of a PCB, such as the transmitter (Tx) IC 101' and the receiver (Rx) IC 102' placed at the same side of the PCB, as shown in FIG. 1. However, direct linkage on the same PCB outer layer between the devices sometimes cannot be established due to the fact that polarity of the terminals 103', 104', and 105', 106' on the devices do not match to each other. In other words, the polarity is reversed. To complete the linkage, either one of the conductors 112' or 113' of the differential transmission lines has to go into the inner layer (or the other outer layer) of the PCB, and return to the original layer again, by adding at least two vias 114', while the other conductor will need to stay at original outer layer. Based on such arrangement, great skew effect will be generated between the two transmission line conductors to degrade the signal quality as the extra reflection and insertion loss are introduced, thus, a demand for reduction of the skew is needed.

For these reasons, it is desirable to provide an improved differential transmission line structure to overcome the drawbacks.

SUMMARY OF THE INVENTION

One objective of the present invention is to provide a PCB with a differential transmission circuit, which reduces skew effect of the differential transmission circuit, thereby improving the signal transmission quality.

To achieve above objective, a PCB of the present invention includes:

a printed circuit board body at least including a first metal layer, a second metal layer formed below the first metal layer, and a first ground layer sandwiched between the first metal layer and the second metal layer; and a pair of transmission lines provided to transmit differential signals, the pair of transmission lines including a first transmission line conductor and a second transmission line conductor.

The first transmission line conductor is located in the first metal layer which has two straight line sections at its two ends and a curved line section at its middle, the second transmission line conductor has two straight line sections at its two ends which are located in the first metal layer and a cross-via structure at the middle which has a buried trace buried in the second metal layer, and the curved line section and the buried trace are isolated by the first ground layer.

Preferably, the curved line section serving as a delay line is S-shaped with two curved portions.

As another embedment, the cross-via structure comprises two via pins extended from the first metal layer to the second metal layer without contacting the first ground layer, and the buried trace connected between the two via pins.

Two first cut-out regions are formed on the first ground layer to accept the via pins.

A second cut-out region is formed on the second metal layer to accept the buried trace, and the area of each first cut-out region through hole is smaller than that of the second cut-out region.

Several grounding paths, in form of vias, are extended from the first ground layer to the second ground layer under the second metal layer, and are located around the second cut-out region. These grounding paths also connect to metal outside the second cut-out region to serve as grounding purpose.

A support layer formed on the bottom of the PCB includes at least one metal layer and one PCB substrate.

As another embodiment, the PCB further includes multiple inner layers formed between the first ground layer and the second metal layer, and a support layer.

As another embodiment, the second metal layer lies on the bottom layer of the PCB.

Preferably, the total physical length of the first transmission line conductor is longer than that of the second transmission line conductor.

Accordingly, as another embodiment, a PCB of the present invention includes:

a printed circuit board body at least including a first metal layer, a first ground layer formed below the first metal layer, and a bottom layer formed below the first ground layer; and a pair of transmission lines provided to transmit differential signals, the pair of transmission lines including a first transmission line conductor and a second transmission line conductor.

The first transmission line conductor is located in the first metal layer which has two straight line sections at its two ends and a curved line section at its middle, the second transmission line conductor has two straight line sections at its two ends which are located in the first metal layer and a cross-via structure at the middle which has a trace located in an outer surface of the bottom layer of the printed circuit board body, and the curved line section and the trace are isolated by the first ground layer.

Preferably, the printed circuit board body further comprises a second metal layer sandwiching between the first ground layer and the bottom layer.

In comparison with the prior art, the curved line section of the present invention is located on the first metal layer, the buried trace is buried in the second metal layer. Thus the skew introduced by the cross-via structure including the via pins and the buried trace is compensated by the curved line section with the increased trace, that is, the curved line section of the first transmission line conductor is served as a delay line to compensate the signal skew. Further, the curved line section is isolated from the buried trace by first ground layer, so that the coupling between the buried trace and the curved line section is reduced, which improve the transmission signal quality and improve the high speed characteristics.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings:

FIG. 4b is a top view of FIG. 4a;

FIG. 5b is a top view of FIG. 5a;

DETAILED DESCRIPTION OF ILLUSTRATED EMBODIMENTS

Figure 1:
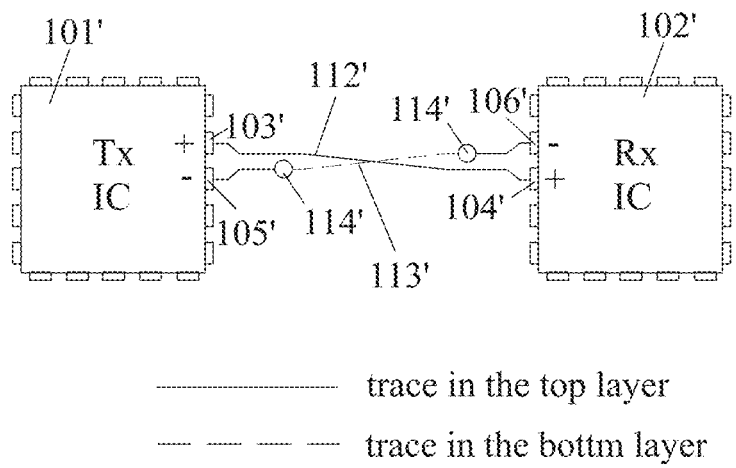
FIG. 1 shows conventional differential transmission lines connection between two ICs placed on the same outer layer of a multi-layer PCB.

Various preferred embodiments of the invention will now be described with reference to the figures, wherein like reference numerals designate similar parts throughout the various views. As indicated above, the invention is directed to a PCB with a differential transmission circuit, which reduces skew effect of the differential transmission circuit, so as to improve the signal transmission quality.

Figure 2:
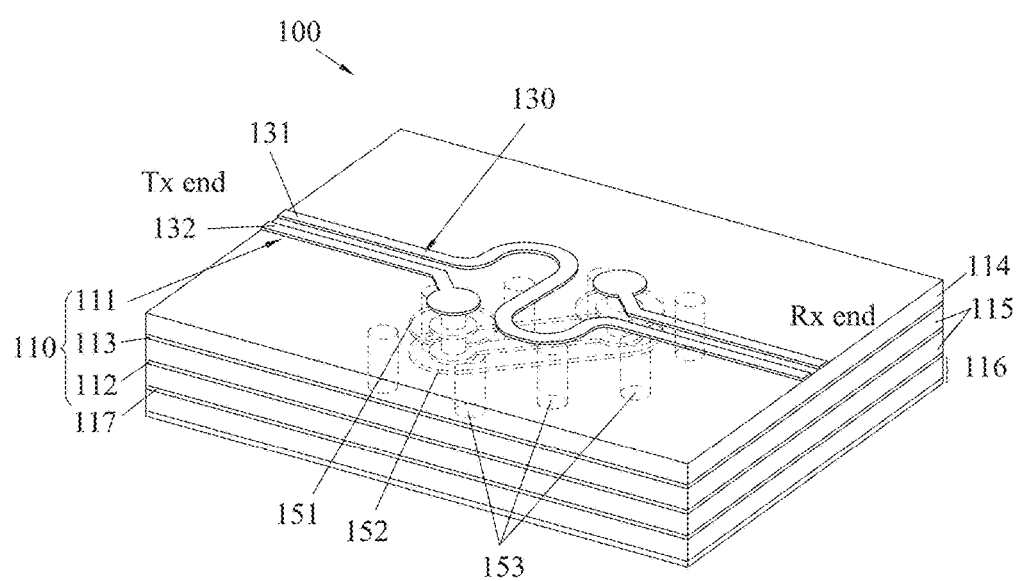
FIG. 2 is a perspective view of a PCB and a pair of differential transmission lines according to a first embodiment of the present invention.
Figure 3A:
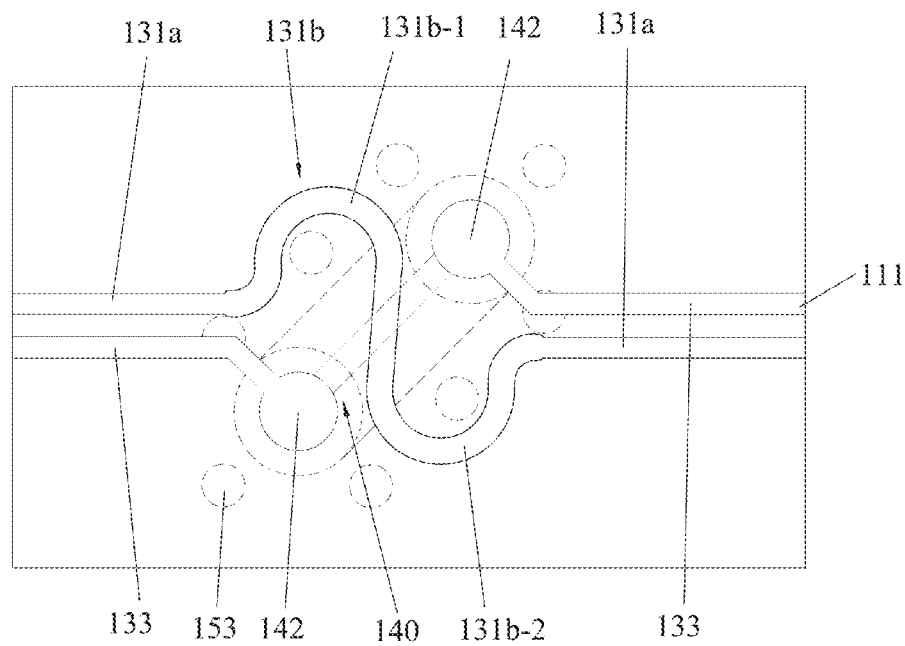
FIG. 3a is a top view of the PCB and the differential transmission lines of FIG. 2.
Figure 3B:
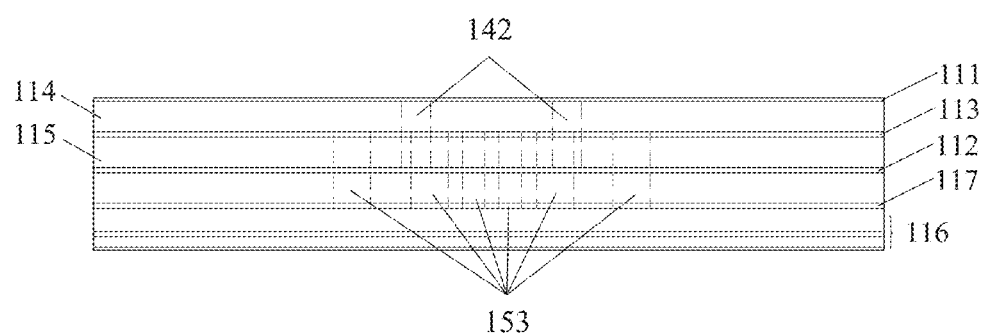
FIG. 3b is a side view of the PCB and the differential transmission lines of FIG. 2.

Referring to FIGS. 2 and 3a, 3b, a PCB 100 according to a first embodiment of the present invention is shown. The PCB 100 includes a PCB body 110 and a differential transmission circuit formed connecting with the PCB body 110. In this embodiment, the PCB body 110 includes a first metal layer 111 at the top, a second metal layer 112 at the bottom, and a first ground layer 113 sandwiching between the first metal layer 111 and the second metal layer 112. Further, for electrically separating the metal layers 111, 112, 113, material fillers 114, 115 are filled between the layers. In this embodiment, a second ground layer 117 is formed under second metal layer 112 and the filler 115. And a support layer 116 is formed on the bottom to support the layers and fillers mentioned above, which may include at least one metal layer and one PCB substrate (not labeled). Should note, the first metal layer 111 is made up of the differential transmission circuit, which is attached above the filler 114.

The differential transmission circuit includes a pair of transmission lines 130 provided to transmit differential signals, and two ends of the transmission lines 130 form couple lines and are disposed at Tx end connecting to a transmitter (not shown) in the PCB, and Rx end connecting to a receiver (not shown). Specifically, the pair of transmission lines 130 includes a first transmission line conductor 131 and a second transmission line 132. Referring to FIGS. 2-4b, the first transmission line conductor 131 has two straight line sections 131a at its two ends and a curved line section 131b at the middle connecting with the two straight line sections 131a. The first transmission line conductor 131 serving as a part of the first metal layer 111 is attached above the filler 114. Preferably, the two straight line sections 131a parallel to each other are extended along the same direction and have the same length, and the curved line section b is roughly S-shaped with two curved portions 131b-1 and 131b-2. In a preferable embodiment, the curved portions 131b-1 and 131b-2 are symmetrical, which is not limited however. The function and the advantage of the curved line section 131b will be described thereinafter.

Referring to FIGS. 2, 3a, 3b and 5a, 5b, the second transmission line conductor 132 has two straight line section 133 at two ends, and the two straight line sections 133 are located in the first metal layer 111 and attached on the filler 114. As shown, the second transmission line conductor 132 has a cross-via structure 140 at the middle connecting with the two straight line sections 133. The cross-via structure 140 includes a buried trace 141 connected with the two straight line sections 133 and two via pins 142. Specifically, the two straight line sections 133 are parallel to each other and extended along the same direction. Specifically, the physical lengths of the two straight line sections 133 are the same, and preferably is the same with that of the straight line sections 131a of the first transmission line conductor 131. For connecting the transmitter to the receiver with different polarity on the same PCB side, the buried trace 141 is placed diagonally to lead one of the straight line sections 133 to swap the position with the straight line section 131a of the first transmission line conductor 131.

Figure 4A:
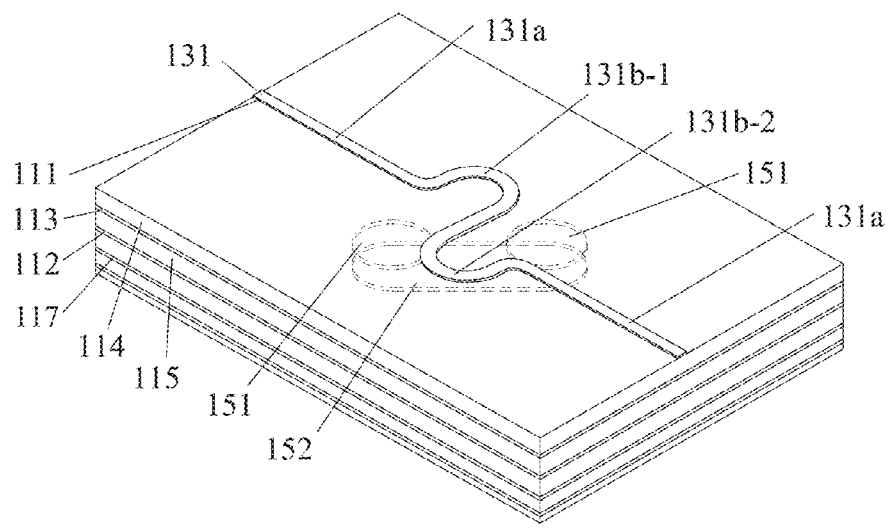
FIG. 4a is a perspective view of the PCB showing the first transmission line conductor on the PCB body, with the second transmission line conductor omitted.
Figure 4B:
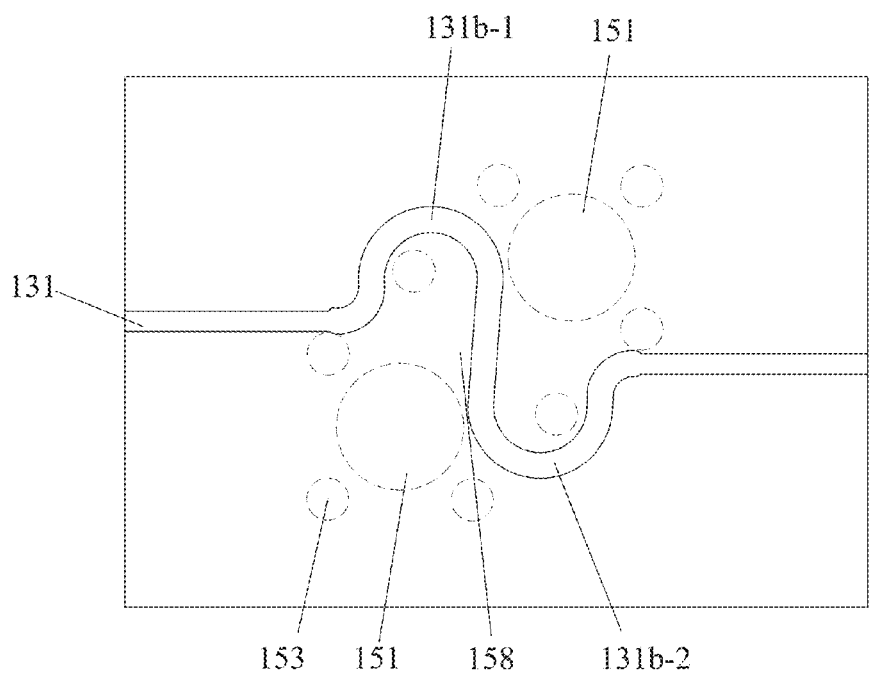
Figure 5A:
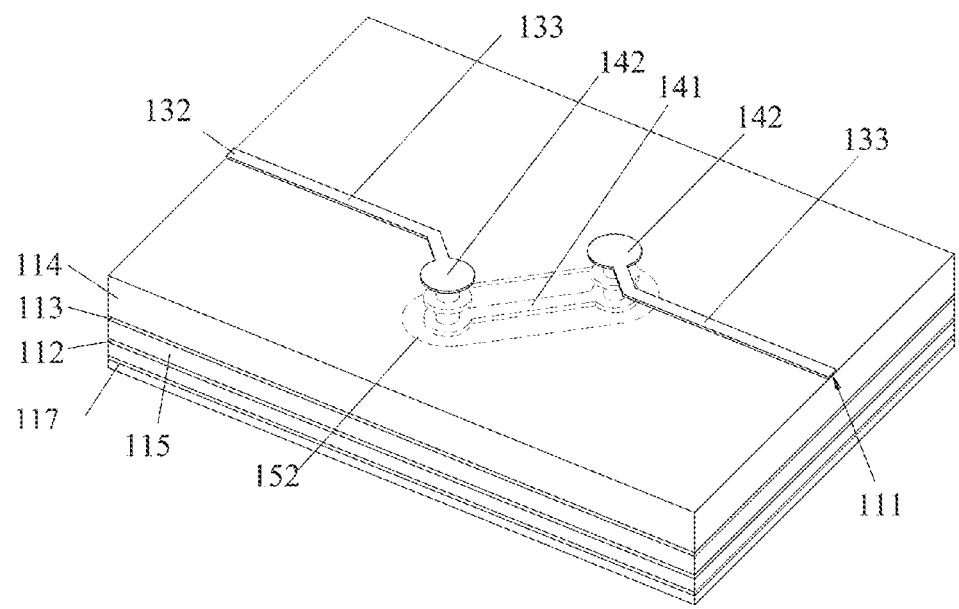
FIG. 5a is a perspective view of the PCB showing the second transmission line conductor on the PCB body, with the first transmission line conductor omitted.
Figure 5B:
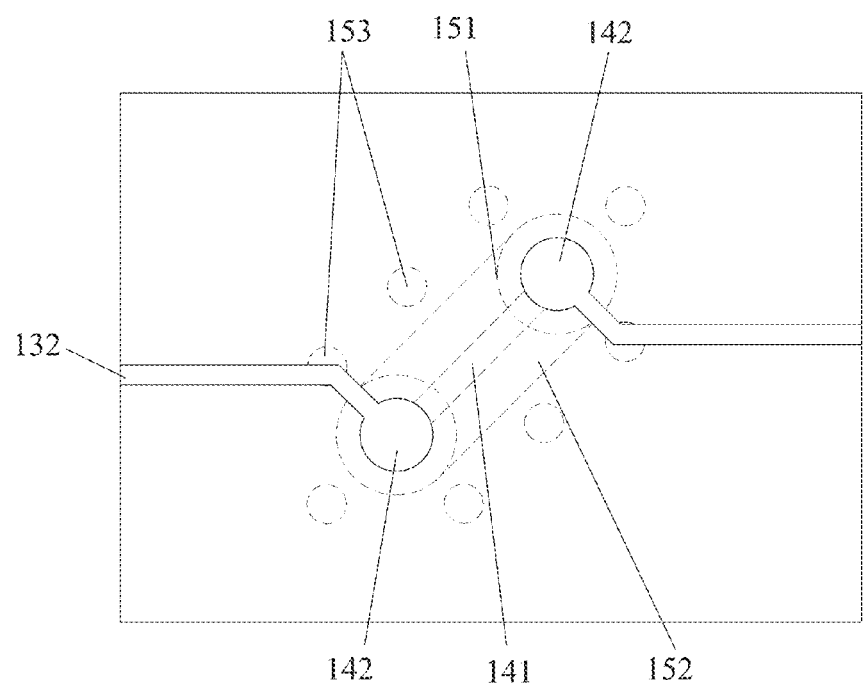

More specifically as shown, each via pin 142 is extended from the first metal layer 111 to the second metal layer 112, with passing through the ground layer 113 but without contacting the first ground layer 113. As shown in FIGS. 4a and 4b, two cut-out regions 151 are formed in the ground layer 113 to allow the via pins 142 to pass through. Preferably, the diameter of the first through holes 151 are larger than that of the via pins 142, so that no interference will happen between the via pins 142 and the ground layer 113. As a preferable embodiment, region 158 of the ground layer 113 located between the two first cut-out regions 151 is not hollowed, so as to isolate the curved line section 131b from the buried trace 141. As shown in FIGS. 5a and 5b, for accepting the buried trace 141, the second metal layer 112 has a second cut-out region 152 formed thereon, and the buried trace 141 is buried in the second metal layer 112. The area of the second cut-out region 152 is larger than that of the first cut-out regions 151.

As another embodiment and shown in FIGS. 2, 3a, 3b and 5b, several grounding path 153 are extended from the first ground layer 113 to the second ground layer 117 under the second metal layer 112, which are located around the second cut-out region 152. Note the number of the grounding path 153 is not limited, and they connect to the second metal layer outside the second cut-out region 152. The grounding path 153 can help to further improve the signal transmission characteristics.

Combining with FIGS. 2-5b, both of the cross-via structure 140 of the second transmission line conductor 132 and the curved line section 131b of the first transmission line conductor 131 are located at the middle of the differential transmission lines, with the corresponding positions. As described above, the curved line section 131b is located in the first metal layer 111, the buried trace 141 is buried in the second metal layer 112, and the curved line section 131b is isolated from the buried trace 141 by the first ground layer 113, especially the region 158, so that the coupling between the buried trace 141 and the curved line section is reduced. The skew introduced by the cross-via structure 140 including the via pins 142 and the buried trace 141 is compensated by the curved line section 131b with the increased trace, that is, the curved line section 131b of the first transmission line conductor 131 is served as a delay line to compensate the signal skew. All these measures improve the transmission signal.

Figure 6A:
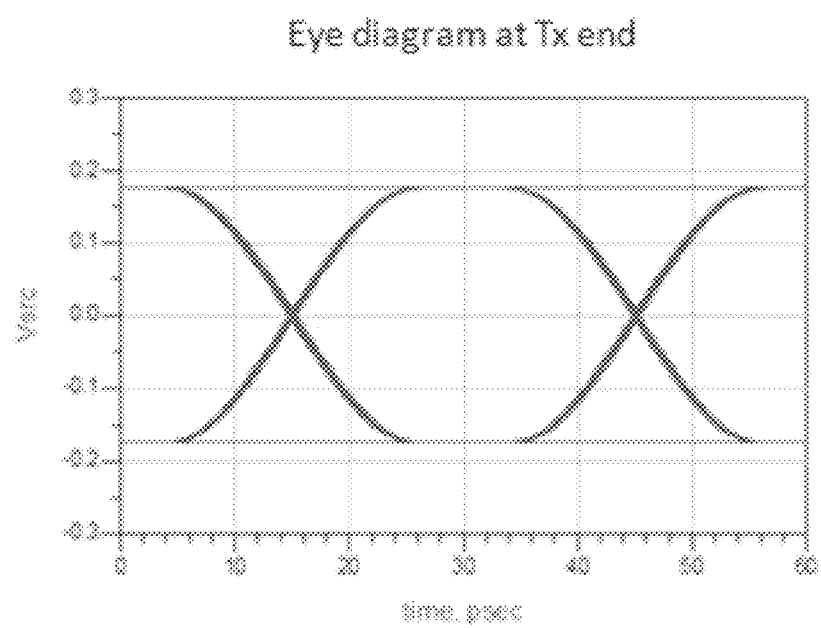
FIG. 6a shows an eye diagram measured at the transmitter (Tx) end of the differential transmission lines.
Figure 6B:
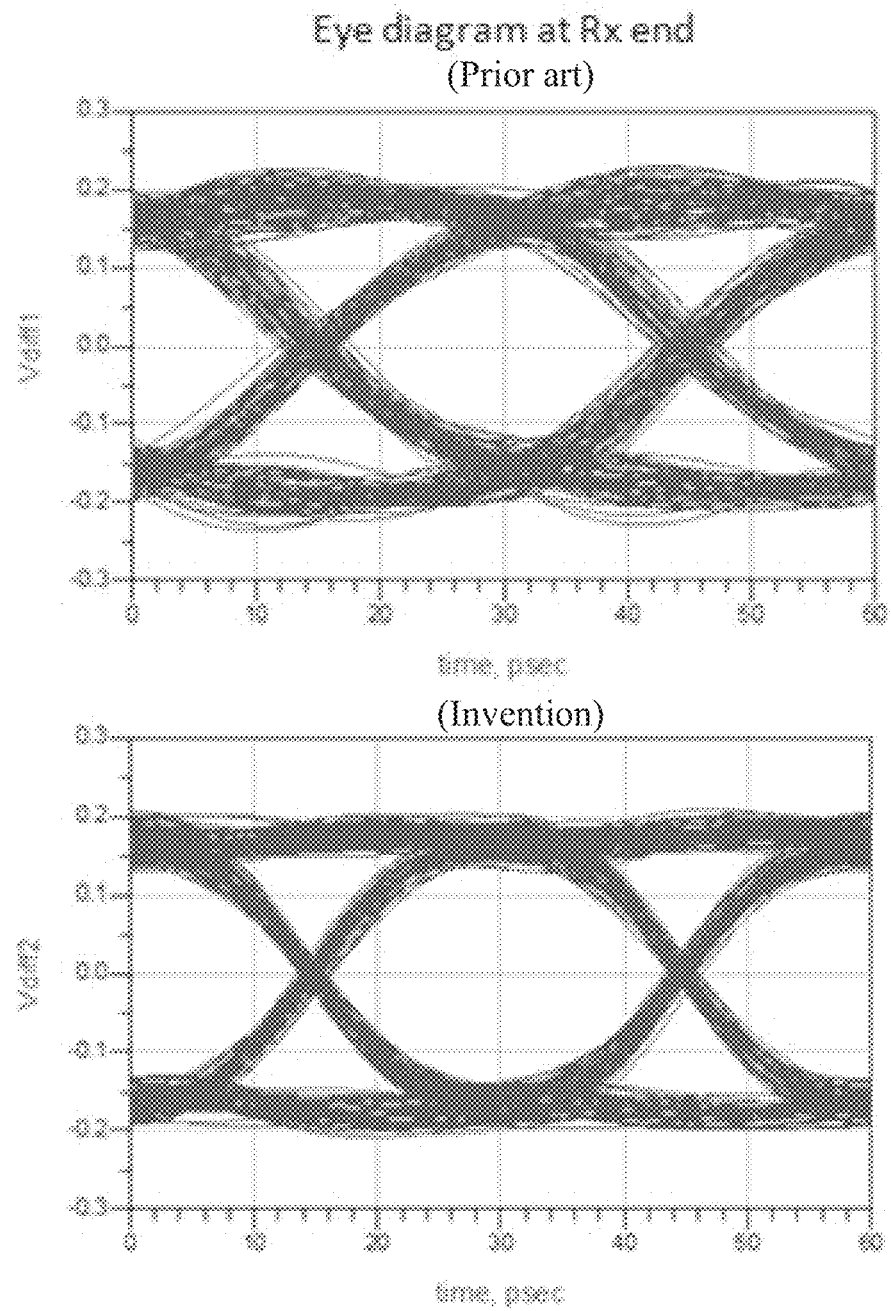
FIG. 6b shows eye diagram comparison measured at the receiver (Rx) end of the differential transmission lines between the prior art and the present invention respectively.

FIG. 6a shows an eye diagram measured at Tx end of the differential transmission lines, FIG. 6b shows a comparison eye diagrams in differential voltage measured at the Rx end between the invention PCB with skew compensation and the prior art PCB without skew compensation. As shown, the eye diagram at the Rx end of the prior art without skew compensation is distorted, and the eye diagram at the Rx end of the invention is clear and precise.

Figure 7:
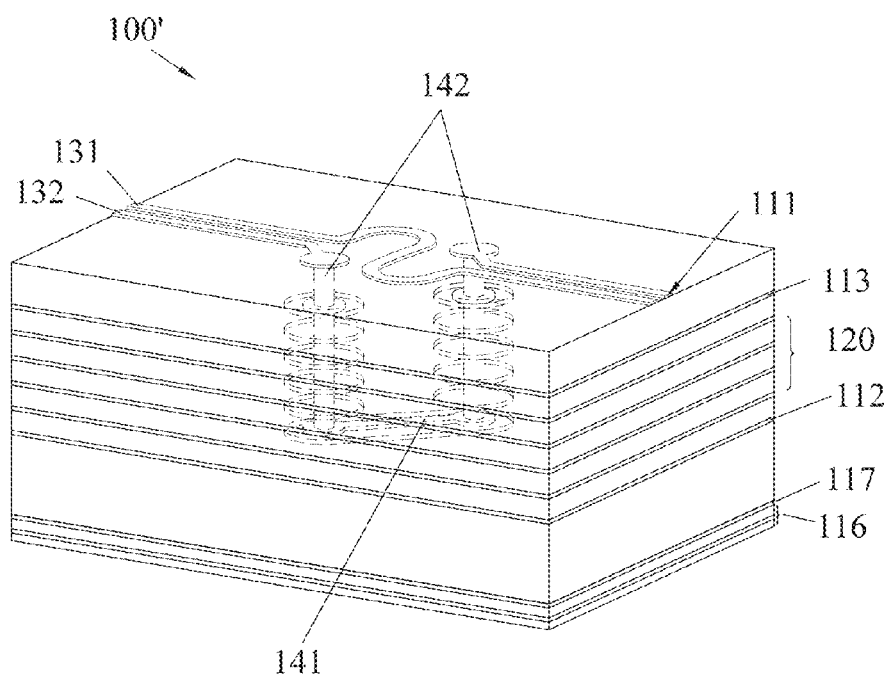
FIG. 7 is a perspective view of a PCB and a pair of differential transmission lines according to a second embodiment of the present invention.
Figure 8:
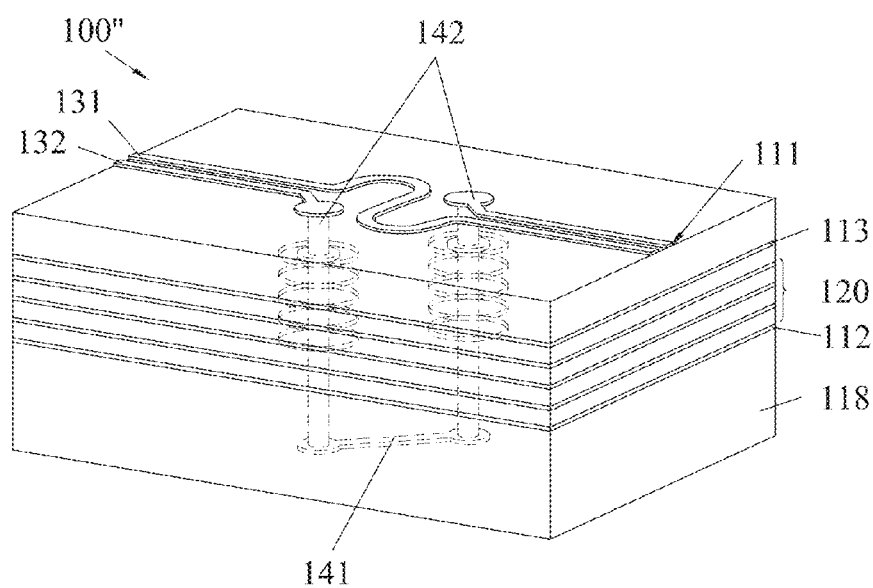
FIG. 8 is a perspective view of a PCB and a pair of differential transmission lines according to a third embodiment of the present invention.
Figure 9:
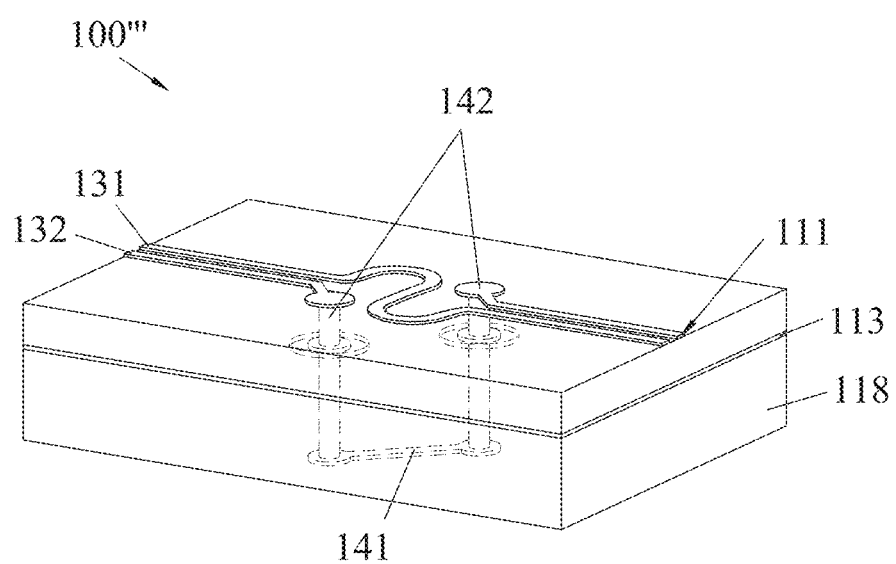
FIG. 9 is a perspective view of a PCB and a pair of differential transmission lines according to a fourth embodiment of the present invention.

FIG. 7 shows a perspective view of the PCB 100' and the differential transmission lines according to a second embodiment of the present invention. FIG. 8 shows a perspective view of the PCB 100" and the differential transmission lines according to a third embodiment of the present invention. In the FIGS. 7 and 8, the configurations of the differential transmission line conductors 131, 132 are similar to those in the first embodiment, except the buried position of the buried trace 141 and the size of the via pins 142. In the optional embodiments shown in FIG. 7, the PCB body further includes multiple inner layers 120 formed between the ground layer 113 and the second metal layer 112, and a support layer 116. Optionally, the number of the inner layers 120 is not limited. FIG. 8 shows that the trace 141' is located in the outer surface of the bottom layer 118 of the PCB body (opposite side of transmission line portions 131a and 133). FIG. 9 shows a perspective view of the PCB 100'" and the differential transmission lines according to a fourth embodiment of the present invention, in this embodiment, the support layer 116 and the second metal layer 112 are omitted, and the trace 141' is located in the outer surface of the bottom layer 118 of the PCB body.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A printed circuit board comprising:
   a printed circuit board body including at least a first metal layer, a second metal layer formed below the first metal layer, and a first ground layer sandwiched between the first metal layer and the second metal layer; and
   a pair of transmission lines provided to transmit differential signals, the pair of transmission lines including a first transmission line conductor and a second transmission line conductor;
   wherein the first transmission line conductor is located in the first metal layer, the first transmission line conductor has two straight line sections at its two ends and a curved line section at its middle, the second transmission line conductor has two straight line sections at its two ends and a cross-via structure including a buried trace at its middle, and the curved line section of the first transmission line conductor and the buried trace of the cross-via structure of the second transmission line conductor are isolated by the first ground layer, wherein the total physical length of the first transmission line conductor is longer than that of the second transmission line conductor.

2. A printed circuit board comprising:
   a printed circuit board body including at least a first metal layer, a second metal layer formed below the first metal layer, and a first ground layer sandwiched between the first metal layer and the second metal layer; and
   a pair of transmission lines provided to transmit differential signals, the pair of transmission lines including a first transmission line conductor and a second transmission line conductor;
   wherein the first transmission line conductor is located in the first metal layer, the first transmission line conductor has two straight line sections at its two ends and a curved line section at its middle, the second transmission line conductor has two straight line sections at its two ends and a cross-via structure including a buried trace at its middle, and the curved line section of the first transmission line conductor and the buried trace of the cross-via structure of the second transmission line conductor are isolated by the first ground layer, wherein the curved line section serving as a delay line is roughly S-shaped with two curved portions.

3. The printed circuit board according to claim 2, wherein the cross-via structure of the second transmission line conductor comprises two via pins extended from the first metal layer to the second metal layer without contacting the first ground layer, and the buried trace of the second transmission line conductor connects the two via pins.

4. The printed circuit board according to claim 3, wherein two first cut-out regions are formed on the first ground layer to accept the via pins, and a second cut-out region is formed on the second metal layer to accept the buried trace, and the area of each first cut-out region is smaller than that of the second cut-out region.

5. The printed circuit board according to claim 4, further comprising a second ground layer under the second metal layer, and several grounding paths extending from the first ground layer to the second ground layer under the second metal layer, connecting to the second metal layer outside the second cut-out region, and located around the second cut-out region.

6. The printed circuit board according to claim 4, wherein a region of the ground layer located on the first ground layer and between the two first cut-out regions is not hollowed.

7. The printed circuit board according to claim 2, wherein the total physical length of the first transmission line conductor is longer than that of the second transmission line conductor.

8. The printed circuit board according to claim 2, further comprising multiple inner layers formed between the first ground layer and the second metal layer, and a support layer.

9. A printed circuit board comprising:
a printed circuit board body including at least a first metal layer, a first ground layer formed below the first metal layer, and a bottom layer formed below the first ground layer; and
a pair of transmission lines provided to transmit differential signals, the pair of transmission lines including a first transmission line conductor and a second transmission line conductor;
wherein the first transmission line conductor is located in the first metal layer, the first transmission line conductor has two straight line sections at its two ends and a curved line section at its middle, the second transmission line conductor has two straight line sections at its two ends and a cross-via structure at its middle, the two straight line sections of the second transmission line conductors are located in the first metal layer, the cross-via structure of the second transmission line conductor has a trace located in an outer surface of the bottom layer of the printed circuit board body, and the curved line section of the first transmission line conductor and the trace of the cross-via structure of the second transmission line conductor are isolated by the first ground layer, wherein the curved line section serving as a delay line is roughly S-shaped with two curved portions.

10. The printed circuit board according to claim 9, wherein the printed circuit board body further comprises a second metal layer sandwiched between the first ground layer and the bottom layer.

* * * * *